(12) United States Patent  
Chang

(10) Patent No.: US 8,106,687 B2
(45) Date of Patent: Jan. 31, 2012

(54) SPREAD SPECTRUM CLOCK SYSTEM AND SPREAD SPECTRUM CLOCK GENERATOR

(75) Inventor: Keng-Yu Chang, Sinshih Township, Tainan County (TW)

(73) Assignee: Himax Technologies Limited, Tainan County (TW)

( * ) Notice: Subject to any disclaimer, the term of this patent is extended or adjusted under 35 U.S.C. 154(b) by 99 days.

(21) Appl. No.: 12/824,483

(22) Filed: Jun. 28, 2010

(65) Prior Publication Data

US 2011/0316591 A1    Dec. 29, 2011

(51) Int. Cl.
*H03K 4/06* (2006.01)
(52) U.S. Cl. .................... 327/131; 327/114; 327/157
(58) Field of Classification Search ............. 327/114, 327/131, 157
See application file for complete search history.

(56) References Cited

U.S. PATENT DOCUMENTS

| 6,240,123 | B1 | 5/2001 | Zhang et al. |
| 6,442,188 | B1 | 8/2002 | Zhang et al. |
| 6,665,019 | B1 | 12/2003 | Pronkine |
| 2007/0182464 | A1* | 8/2007 | Sekiguchi et al. ............ 327/131 |

* cited by examiner

*Primary Examiner* — Lincoln Donovan
*Assistant Examiner* — John Poos
(74) *Attorney, Agent, or Firm* — Thomas, Kayden, Horstemeyer & Risley, LLP

(57) ABSTRACT

A spread spectrum clock generator includes a triangular wave generator, a digital wave modulator, a sigma delta modulator, and a selector. The triangular wave generator transforms one of the input clock signals into an original triangular wave signal, in which the input clock signals have the same frequency and phases different from each other. The digital wave modulator adjusts the waveform of the original triangular wave signal to generate an adjusted triangular wave signal and a first square wave signal according to an inputted control signal. The sigma delta modulator, electrically connected to the digital wave modulator, accumulates magnitude values of the adjusted triangular wave signal to generate a second square wave signal. The selector selects one of the input clock signals as an output clock signal based on voltage levels of the first square wave signal and the second square wave signal.

12 Claims, 2 Drawing Sheets

SPREAD SPECTRUM CLOCK SYSTEM AND SPREAD SPECTRUM CLOCK GENERATOR

BACKGROUND

1. Field of Invention

The present invention relates to a spread spectrum clock generator. More particularly, the present invention relates to a spread spectrum clock generator with frequency tuning.

2. Description of Related Art

High-speed systems, such as wireless phones, optical fiber links, microcomputers, and high-end system-on-a-chip (SOCs), reach the GHZ level. Therefore, the electronic devices need to upgrade their operating frequency in order to keep up with the speed increased systems. Furthermore, since many circuits are integrated on a chip, the clock signal is entirely distributed on the chip, and the clock skew problem arises as a result.

For example, when an input clock drives a chip, an uncertain delay appears between the input clock and the internal clock, which might make the chip work incorrectly. In order to synchronize the system clock and suppress the clock skew of the chip, the phase-locked loop (PLLs) and delay-locked loop (DLLs) have been applied in many high-speed circuits and systems.

As the transfer rates increases, the Electro-Magnetic Interference (EMI) that affects or destroys the performance of peripheral electronic components gets even worse, and the peripheral electronic components can not be used as a result. Since the clock signal generated by the clock generator is the main source causing the EMI phenomenon, it is important to reduce the EMI phenomenon caused by the clock generator.

Presently, Spread Spectrum Clock Generator (SSCG) is commonly used to reduce the EMI phenomenon. As the name suggests, "Spread spectrum" means to spread the center frequency of the clock signal with less amount, which reduces the energy of the main frequency and disperses the reduced energy to other frequencies than the main frequency. Since the energy of the main frequency is reduced, the EMI phenomenon can also be reduced.

Spectrum spreading, varying the frequency of the clock signal, is used to reduce the EMI effect. Although the spread spectrum reduces the EMI effects, the jitter of the clock signal deteriorates, such that users often need to compromise between the clock jitter and the spread amount. The amount of the spread spectrum of the clock generator cannot be adjusted flexibly, and the user cannot adjust the amount of spread spectrum in accordance with the actual situation. Because users can not trade-off between the amount of the spread spectrum and the clock jitter, the overall performance goes down.

Therefore, there is a need for a new spread spectrum clock generator which can adjust the average frequency of the clock signal more flexible.

SUMMARY

According to one embodiment of the present invention, a spread spectrum clock generator includes a triangular wave generator, a digital wave modulator, a sigma delta modulator, and a selector. The triangular wave generator transforms one of a plurality of input clock signals into an original triangular wave signal, in which the input clock signals have the same frequency and phases different from each other. The digital wave modulator adjusts the waveform of the original triangular wave signal to generate an adjusted triangular wave signal and a first square wave signal corresponding to the adjusted triangular wave signal according to an inputted control signal. The sigma delta modulator, electrically connected to the digital wave modulator, accumulates magnitude values of the adjusted triangular wave signal to generate a second square wave signal. The selector selects one of the input clock signals as an output clock signal based on voltage levels of the first square wave signal and the second square wave signal, in which an average frequency of the output clock signal is different form the frequency of the input clock signals.

According to another embodiment of the present invention, a spread spectrum clock system includes an oscillator, a phase locked loop, a triangular wave generator, a digital wave modulator, a sigma delta modulator, and a selector. The oscillator generates a periodical signal. The phase locked loop changes frequency of the periodical signal to generate a plurality of input clock signals. The triangular wave generator transforms one of the input clock signals into an original triangular wave signal, in which the input clock signals have the same frequency and phases different from each other. The digital wave modulator adjusts the waveform of the original triangular wave signal to generate an adjusted triangular wave signal and a first square wave signal corresponding to the adjusted triangular wave signal according to an inputted control signal. The sigma delta modulator, electrically connected to the digital wave modulator, accumulates magnitude values of the adjusted triangular wave signal to generate a second square wave signal. The selector selects one of the input clock signals as an output clock signal based on voltage levels of the first square wave signal and the second square wave signal, in which an average frequency of the output clock signal is different form the frequency of the input clock signals.

It is to be understood that both the foregoing general description and the following detailed description are by examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1:
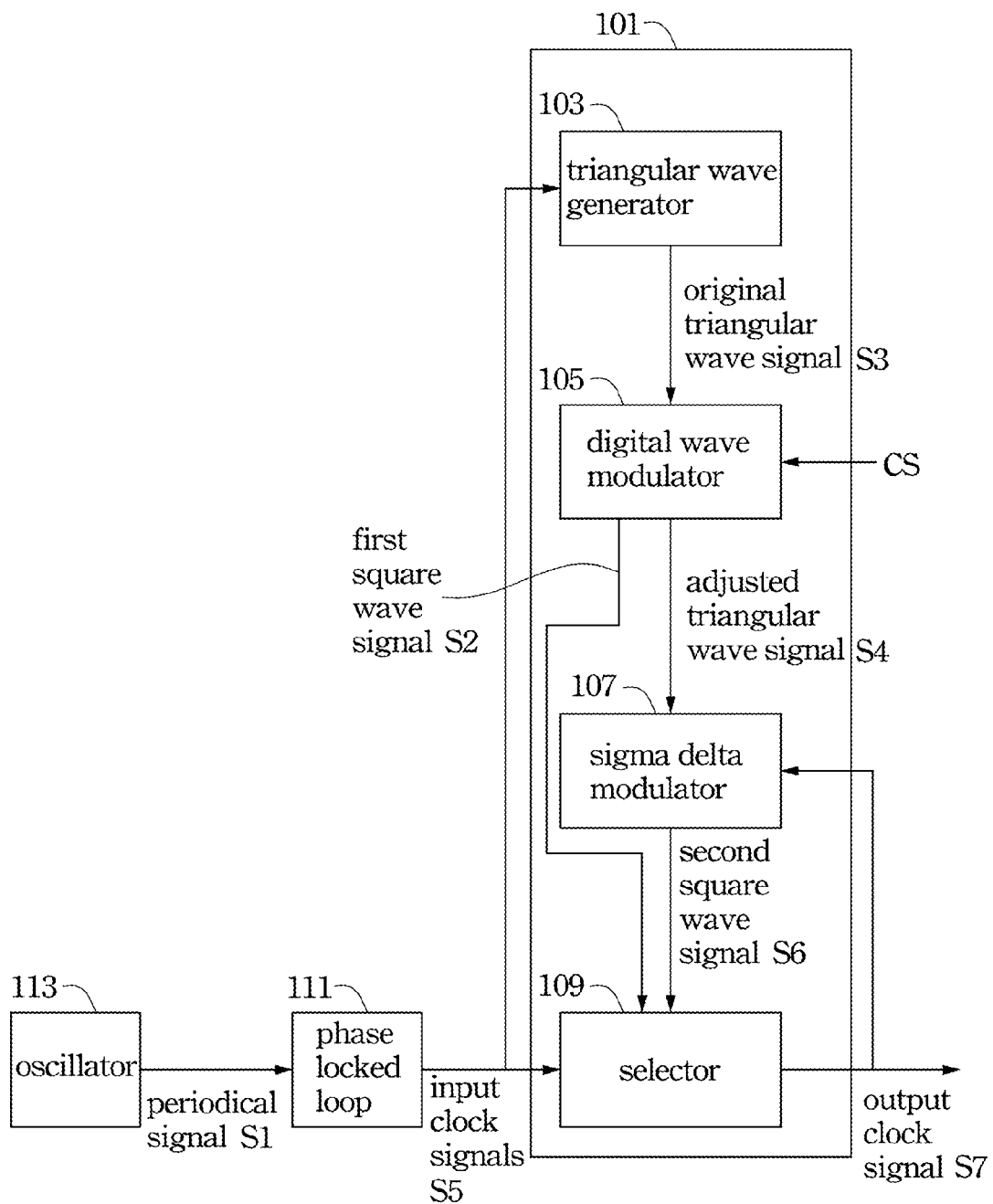
FIG. 1 is a block diagram of the spread spectrum clock system according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
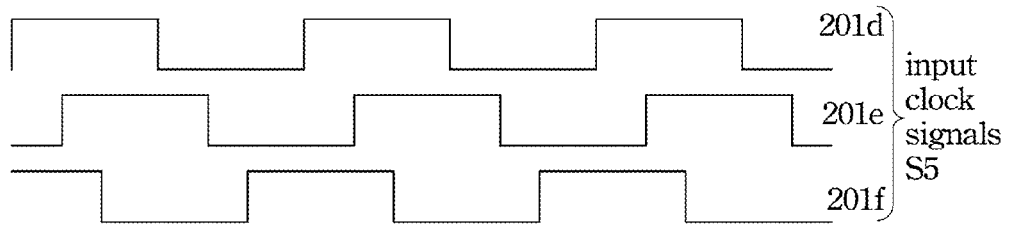
FIG. 2A~FIG. 2D show the signal waveforms of the spread spectrum clock system according to one embodiment of this invention.
Figure 2B:
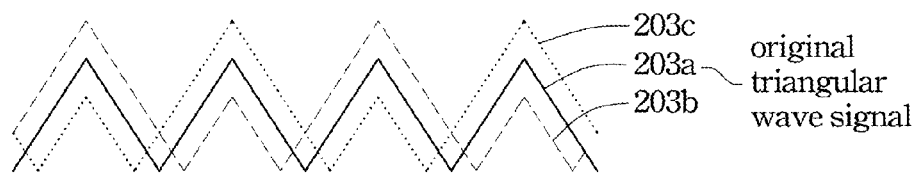
Figure 2C:
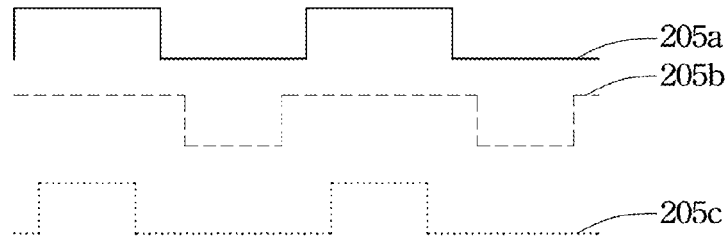
Figure 2D:
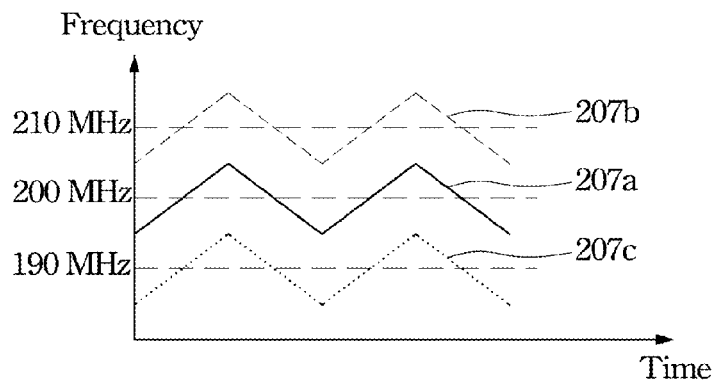

FIG. 1 is a block diagram of the spread spectrum clock system according to one embodiment of the present invention, while FIG. 2A to 2D show the signal waveforms of the spread spectrum clock system according to one embodiment of the present invention. In more detail, FIG. 2A shows the partial input clock signals 201$d$, 201$e$ and 201$f$; and FIG. 2D shows the time vs. frequency relation for each output clock signal 207$a$, 207$b$ and 207$c$.

The spread spectrum clock system 115 includes an oscillator 113, a phase locked loop 111, and a spread spectrum clock generator 101. The oscillator 113 generates a periodical signal S1. The phase locked loop 111 changes frequency of the periodical signal S1 to generate several input clock signals S5 (i.e. the input clock signals 201d, 201e and 201f in FIG. 2A), in which all the input clock signals S5 have the same frequency and different phases.

Next, the spread spectrum clock generator 101 generates the output clock signal S7 (i.e. the output clock signal 207a, 207b or 207c in FIG. 2D) by executing operation of selecting one of the input clock signals S5, in which the temporal frequency of the output clock signal S7 varies with time, while all the input clock signals S5 have the same frequency and different phases. For example, the temporal frequency of the output clock signal S7 can be 210 MHz, 211 MHz, 209 MHz as the time proceeds, shown in 207b in FIG. 2D.

The spread spectrum clock generator 101 includes a triangular wave generator 103, a digital wave modulator 105, a sigma delta modulator 107, and a selector 109. FIG. 2B shows the waveform of one original triangular wave signal 203a and two adjusted triangular wave signal 203b and 203c. FIG. 2C shows the duty cycle of the square wave signals 205a, 205b and 205c which are respectively correspond to the original triangular wave signal 203a and the two adjusted triangular wave signal 203b and 203c. The triangular wave generator 103 transforms one of the input clock signals S5 into an original triangular wave signal S3 (i.e., 203a in FIG. 2B).

The digital wave modulator 105 adjusts the waveform of the original triangular wave signal S3 (i.e., 203a in FIG. 2B) to generate an adjusted triangular wave signal S4 (i.e., 203b or 203c in FIG. 2B) and a corresponding first square wave signal S2 (i.e., 205b or 205c in FIG. 2C) according to the inputted control signal CS modified by an user. The corresponding first square wave signal S2 might be used as an index for the selector 109 to choose the input clock signal S5 having the specific phase (e.g., leading phase or falling phase) if the current selected input signal is necessary to be changed. For instance, the digital wave modulator 105 can adjust the frequency and/or the amplitude of the original triangular wave signal S3 (e.g., 203a in FIG. 2b) to generate the adjusted triangular wave signal S4 (e.g., 203c in FIG. 2b) and the first square wave signal S2 (e.g., 205c in FIG. 2c) according to an inputted control signal CS modified by a user. For example, the inputted control signal CS is obtained based on the average frequency and amount of spread spectrum, which are determined by a user.

The sigma delta modulator 107, electrically connected to the digital wave modulator 105, accumulates magnitude values of the adjusted triangular wave signal S4 (i.e., 203b or 203c in FIG. 2B) from the digital wave modulator 105 to generate the second square wave signal S6, in which the second square wave signal S6 is logic 0 or logic 1. The second square wave signal S6 might be the index for the selector 109 to decide whether the current selected input clock signal is necessary to be changed or not. In this embodiment, the sigma delta modulator 107 is triggered by the feedback output clock signal S7.

The selector 109 then selects one from the input clock signals S5 as the output clock signal S7 based on the voltage levels of the received second square wave signal S6 and the first square wave signal S2.

The following table I shows the operation of the selector 109 and the relation between the first square wave signal S2, the second square wave signal S6 outputted from the sigma delta modulator 107, and the selected input clock signal for the output clock signals S7. According to the table I, one of the input clock signals S5 is selected by the selector 109 in accordance with the first square wave signal S2 and the second square wave signal S6. In more detail, the second square wave signal S6 decides if it is necessary to change the current selected input clock signal in first. If the second square wave signal S6 decides it is necessary to change the current selected input clock signal (i.e., state 2 and 4 in Table I), the first square wave signal S2 decides which one of the previous output clock signal 201d (falling phase) and the next output clock signal 201f (leading phase) to be selected as the output clock signal S7.

For example, when the current selected input clock signal is 201e and the second square wave signal S6 is logic 1, the selector 109 selects one of the input clock signals S5 to change the current selected input signal based on the logic level of the first square wave signal S2. In this case, the input clock signal 201d is selected if the first square wave signal S2 is logic 0, and the input clock signals 201f is selected if the first square wave signal S2 is logic 1. In additional, when the second square wave signal S6 is logic 0 (i.e., state 1 and 3 in Table I), the selector 109 maintains the current selected input signal 201e as the output clock signal S7.

TABLE I

|  | First square wave signal S2 | Second square wave signal S6 | Output clock signal S7 |
| --- | --- | --- | --- |
| State 1 | Logic 0 | Logic 0 | 201e |
| State 2 | Logic 0 | Logic 1 | 201d |
| State 3 | Logic 1 | Logic 0 | 201e |
| State 4 | Logic 1 | Logic 1 | 201f |

Each change of the current selected input signal causes the variance of a period/cycle of a clock of the output clock signal S7 (i.e., the frequency of the output clock signal S7 is changed). The average frequency of the output clock signal S7 might be the same or different from the frequency of the input clock signals S5 according to the inputted control signal CS. For example, the frequency of the input clock signals S5 is 200 MHz, the average frequency of the output clock signal might be 210 MHz by the adjustment of the inputted control signal CS (the waveform of the original triangular wave signal 203a is adjusted to the adjusted triangular wave 203b, in FIG. 2B). The average frequency of the output clock signal S7 is particularly not a multiple of the frequency of the input clock signal S5 in this case. In other cases, the average frequency of the output clock signal S7 is equal to the frequency of the input clock signals S5 when the inputted control signal CS maintains the original triangular wave 203a or before the sigma delta modulator 107 is triggered by the feedback output clock signal S7. Therefore, the output clock signal S7 can be spread more flexibly with the digital wave modulator 105.

Eventually, in FIG. 2D, the average frequency 207b of the output clock signal is 210 MHz, and the average frequency 207c of the output clock signal is 190 MHz, which are slightly different from the 200 MHz frequency of the input clock signal.

According to the above embodiment, the average frequency of the output clock signal might be the same or slightly different from the frequency of the input clock signals. The output clock signal can thus be spread more flexibly.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A spread spectrum clock generator, comprising:

a triangular wave generator for transforming one of a plurality of input clock signals into an original triangular wave signal, wherein the input clock signals have the same frequency and have phases different from each other;

a digital wave modulator for adjusting waveform of the original triangular wave signal to generate an adjusted triangular wave signal and a first square wave signal corresponding to the adjusted triangular wave signal according to an inputted control signal;

a sigma delta modulator, electrically connected to the digital wave modulator, for accumulating magnitude values of the adjusted triangular wave signal to generate a second square wave signal; and a selector for selecting one of the input clock signals as an output clock signal based on voltage levels of the second square wave signal and the first square wave signal, wherein an average frequency of the output clock signal is different form the frequency of the input clock signals.

2. The spread spectrum clock generator as claimed in claim 1, wherein the digital wave modulator further adjusts the frequency of the original triangular wave signal to generate the adjusted triangular wave signal.

3. The spread spectrum clock generator as claimed in claim 1, wherein the digital wave modulator further adjusts amplitude of the original triangular wave signal to generate the adjusted triangular wave signal.

4. The spread spectrum clock generator as claimed in claim 1, wherein a temporal frequency of the output clock signal varies with time.

5. The spread spectrum clock generator as claimed in claim 1, wherein the output clock signal is feedback to the sigma delta modulator for triggering the sigma delta modulator to generate the second square wave signal.

6. The spread spectrum clock generator as claimed in claim 5, wherein the average frequency of the output clock signal is equal to the frequency of the input clock signals before the sigma delta modulator is triggered.

7. A spread spectrum clock system, comprising:

an oscillator for generating a periodical signal;

a phase locked loop for changing frequency of the periodical signal to generate a plurality of input clock signals, wherein the input clock signals have the same frequency and have phases different from each other;

a triangular wave generator for transforming one of the input clock signals into an original triangular wave signal;

a digital wave modulator for adjusting waveform of the original triangular wave signal to generate an adjusted triangular wave signal and a first square wave signal corresponding to the adjusted triangular wave signal according to an inputted control signal;

a sigma delta modulator, electrically connected to the digital wave modulator, for accumulating magnitude values of the adjusted triangular wave signal to generate a second square wave signal; and a selector for selecting one of the input clock signals as an output clock signal based on voltage level of the first square wave signal and the second square wave signal, wherein an average frequency of the output clock signal is different form the frequency of the input clock signals.

8. The spread spectrum clock system as claimed in claim 7, wherein the digital wave modulator further adjusts the frequency of the original triangular wave signal to generate the adjusted triangular wave signal.

9. The spread spectrum clock system as claimed in claim 7, wherein the digital wave modulator further adjusts amplitude of the original triangular wave signal to generate the adjusted triangular wave signal.

10. The spread spectrum clock system as claimed in claim 7, wherein a temporal frequency of the output clock signal varies with time.

11. The spread spectrum clock system as claimed in claim 7, wherein the output clock signal is feedback to the sigma delta modulator for triggering the sigma delta modulator to generate the second square wave signal.

12. The spread spectrum clock system as claimed in claim 11, wherein the average frequency of the output clock signal is equal to the frequency of the input clock signals before the sigma delta modulator is triggered.

* * * * *